United States Patent
Duong et al.

(10) Patent No.: US 8,784,572 B2
(45) Date of Patent: *Jul. 22, 2014

(54) METHOD FOR CLEANING PLATINUM RESIDUES ON A SEMICONDUCTOR SUBSTRATE

(75) Inventors: Anh Duong, Fremont, CA (US); Sean Barstow, San Jose, CA (US); Olov Karlsson, San Jose, CA (US); Bei Li, Fremont, CA (US); James Mavrinac, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/276,973

(22) Filed: Oct. 19, 2011

(65) Prior Publication Data

US 2013/0098393 A1 Apr. 25, 2013

(51) Int. Cl.
*B08B 3/00* (2006.01)
(52) U.S. Cl.
USPC .............................................. 134/28; 134/26
(58) Field of Classification Search
None
See application file for complete search history.

(56) References Cited

U.S. PATENT DOCUMENTS

| | | | |
|---|---|---|---|
| 5,795,492 A | | 8/1998 | Reis |
| 5,810,940 A * | | 9/1998 | Fukazawa et al. ............ 134/3 |
| 5,977,041 A * | | 11/1999 | Honda ........................ 510/175 |
| 6,432,836 B1 | | 8/2002 | Watanabe |
| 7,270,762 B2 | | 9/2007 | Wang et al. |
| 7,344,978 B2 | | 3/2008 | Chang |
| 2005/0011537 A1 | | 1/2005 | Toshima |
| 2006/0027463 A1 | | 2/2006 | Lavelle |
| 2006/0144791 A1 | | 7/2006 | Debe et al. |
| 2006/0266737 A1 * | | 11/2006 | Hanestad et al. ............... 216/96 |
| 2007/0020925 A1 | | 1/2007 | Hsieh et al. |
| 2008/0090369 A1 | | 4/2008 | Akiyama |
| 2009/0127594 A1 | | 5/2009 | Arunachalam |
| 2009/0309228 A1 * | | 12/2009 | Fang et al. .................... 257/769 |
| 2010/0178764 A1 * | | 7/2010 | Narita et al. .................. 438/664 |
| 2010/0221912 A1 | | 9/2010 | Nakayama et al. |
| 2010/0252888 A1 | | 10/2010 | Iwamoto |

FOREIGN PATENT DOCUMENTS

ZA 9602382 A * 12/1996

OTHER PUBLICATIONS

ZA 9602382 A—abstract as retrieved from East. Dec. 31, 1996. pp. 1-2.*
McLaughlin, et al. The Aqueous Cleaning Handbook. 2002, AL Technical Communications, LLC, 3rd Ed, pp. 23-26.*
Abstract of ZA 9602382 A.*
Chen, Y., et al.; Advances on 32nm NiPt Salicide Process; Jan. 1, 2009; IEEE; 17th IEEE International Conference on Advanced thermal Processing of Semiconductors 4 pages.
Goh, F., et al.; Challenges in Nickel Platinum silicide Wet Etching for Sub65nm Device Technology; Jan. 1, 2007; Chartered Semiconductor Manufacturing Ltd.; Goh F. et al.
Xu, K., et al.; Post Salicidation Clean Selective Removal of Unreacted NiPt towards NiPtSiGe; Jan. 1, 2007; IMEC; Xu K. et al.

(Continued)

*Primary Examiner* — Nicole Blan

(57) ABSTRACT

A method for cleaning platinum residues from a surface of a substrate is provided. The method initiates with exposing the surface to a first solution containing a mixture of nitric acid and hydrochloric acid. Then, the surface is exposed to a second solution containing hydrochloric acid.

11 Claims, 3 Drawing Sheets

(56) References Cited

OTHER PUBLICATIONS

Baghalha, M., et al.; Kinetics of Platinum Extracton From Spent Reforming Catalysts in AquaRegia Solutions; Jun. 17, 2008; Sharif University of Technology, Iran; Hydrometallurgy vol. 95 Issues 34 pp. 247253.

Hoummada, K, et al.; Effect of Pt Addition on Ni Silicide Formation at Low Temperature Growth Redistribution and Solubility; Sep. 21, 2009; 1Aix-Marseille Université, France; Journal of Applied Physics pp. 106114.

Demeulemeester, J., et al.; Pt Redistribution During NiPt Silicide Formation; Dec. 31, 2008; lInstituut voor Kern-en Stralingsfysica and INPAC, Belgium; Applied Physics Letters pp. 9395.

Schweizer, A.E., et al.; Thermal Decomposition of Hexachloroplatinic Acid; Jan. 1, 1978; Air Products and Chemicals, Inc.; Inorganic Chemistry vol. 17 pp. 23262327.

Amazing Rust; Liquid Chlorine; Mar. 29, 2010; International Chemical Supply; 7 pages.

Al-Harahsheh, et al.; MicrowaveAssisted LeachingA Review; Jan. 1, 2004; Academia—University of Nottingham, UK; Hydrometallurgy pp. 189203.

Jafarifar, D., et al.; Ultra Fast MicrowaveAssisted Leaching for Recovery of Platinum from Spent Catalyst; Jan. 1, 2005; Jam Petrochemical Company, Iran; Hydrometallurgy pp. 166171.

\* cited by examiner

METHOD FOR CLEANING PLATINUM RESIDUES ON A SEMICONDUCTOR SUBSTRATE

RELATED APPLICATIONS

This application is related to U.S. application Ser. No. 13/094,967 filed on Apr. 27, 2011 and entitled "COMPOSITION AND METHOD TO REMOVE EXCESS MATERIAL DURING MANUFACTURING OF SEMICONDUCTOR DEVICES," the disclosure of which is incorporated by reference herein.

BACKGROUND

During front-end-of-line (FEOL) processing for CMOS microfabrication, electrode processing includes formation of self-aligned metallic silicides (also known as metallic salicides). In one such silicidation process, an alloy of Ni mixed with about 5 to 10% Pt (weight/weight) is deposited on a silicon substrate and subjected to thermal oxidation, causing the alloy to react with Si and form the silicide. The resulting Ni(Pt)Si demonstrates improved thermal stability as compared to NiSi alone.

To avoid bridging at spacers and isolation areas, after self-aligned silicidation is performed, unreacted NiPt and Pt residues must be removed. The post-salicidation clean process should optimally be selective so as to remove the residues without damaging exposed materials such as $Si_3N_4$ (spacers), $SiO_2$ (field oxide), Ni(Pt)Si (contact and gate electrodes, and NiPtSiGe (contact electrodes of source/drain for strain applications).

Aqua regia, which is a solution of nitric acid and hydrochloric acid, is commonly used to remove unreacted NiPt and Pt residues from the substrate surface. However, as the concentration of Pt increases, aqua regia alone does not achieve complete removal of post-salicidation Pt residues due to temperature constraints during processing. Several other chemicals have been tested as a substitution for aqua regia, but none provides adequate cleaning performance without attacking TiN, SiN, and $SiO_2$.

It is in this context that embodiments of the invention arise.

SUMMARY

Embodiments of the present invention provide a method for removing platinum residues from a surface of a substrate. Several inventive embodiments of the present invention are described below.

In one aspect of the invention, a method for cleaning platinum residues from a surface of a substrate is provided. The method initiates with exposing the surface to a first solution containing a mixture of nitric acid and hydrochloric acid. Then, the surface is exposed to a second solution containing hydrochloric acid.

In some embodiments the molar ratio of nitric acid to hydrochloric acid in the first solution is approximately 1:3 to 1:12, and the second solution has a concentration of hydrochloric acid of approximately 10% to 20% by volume.

In some embodiments the exposure to the first solution is performed at approximately 20 to 30 degrees Celsius for approximately 3 to 7 minutes.

In some embodiments the exposure to the second solution is performed at approximately 40 to 80 degrees Celsius for approximately 1 to 5 minutes.

In some embodiments the exposure to the second solution is performed at approximately 60 to 80 degrees Celsius for approximately 1 to 3 minutes.

In some embodiments after the exposure to the first solution, the surface of the substrate is rinsed with de-ionized water before exposing the surface to the second solution. In some embodiments the rinsing of the surface is performed at approximately 20 to 30 degrees Celsius for approximately 1 to 3 minutes.

In some embodiments a method for cleaning platinum residues from a surface of a substrate is provided. According to the method, the surface is exposed to a first solution containing a mixture of nitric acid and hydrochloric acid at a molar ratio of approximately 1:3 to 1:12. The surface of the substrate is rinsed with deionized water. Then the surface is exposed to a second solution containing hydrochloric acid at a concentration of approximately 10% to 20% by volume.

In some embodiments after rinsing the surface of the substrate, the surface is dried with an inert gas prior to exposing the surface to the second solution. In one embodiment, the inert gas is nitrogen.

In some embodiments the exposure to the first solution is performed at approximately 20 to 30 degrees Celsius for approximately 3 to 7 minutes, and the exposure to the second solution is performed at approximately 60 to 80 degrees Celsius for approximately 1 to 3 minutes.

In some embodiments the second solution is saturated with chlorine gas.

In some embodiments a system for cleaning platinum residues from a surface of a substrate is provided. The system includes a first solution source containing a first solution, the first solution including a mixture of nitric acid and hydrochloric acid. A second solution source contains a second solution, the second solution including hydrochloric acid. A process chamber is provided, the process chamber having a first dispenser for dispensing the first solution onto the substrate and a second dispenser for dispensing the second solution onto the substrate. The system further includes a controller configured to control the process chamber, the first dispenser, and the second dispenser, to provide for exposure of the substrate to the first solution followed by exposure of the substrate to the second solution.

In some embodiments the molar ratio of nitric acid to hydrochloric acid in the first solution is approximately 1:3 to 1:12, and the second solution has a concentration of hydrochloric acid of approximately 10% to 20% by volume.

In some embodiments the process chamber includes a temperature adjuster for adjusting a temperature of the process chamber, and the controller is configured to control the temperature adjuster.

In some embodiments the controller is configured to control the temperature adjuster and the first dispenser to provide the exposure of the substrate to the first solution at approximately 20 to 30 degrees Celsius for approximately 3 to 7 minutes.

In some embodiments the controller is configured to control the temperature adjuster and the first dispenser to provide the exposure of the substrate to the second solution at approximately 40 to 80 degrees Celsius for approximately 1 to 5 minutes.

In some embodiments the controller is configured to control the temperature adjuster and the first dispenser to provide the exposure to the second solution at approximately 60 to 80 degrees Celsius for approximately 1 to 3 minutes.

In some embodiments the system further includes a deionized water source containing deionized water, and the process chamber includes a third dispenser for dispensing the deionized water. Furthermore, the controller is configured to control the third dispenser to rinse the surface of the substrate with de-ionized water after the exposure to the first solution and before the exposure to the second solution.

In some embodiments the controller is configured to control the temperature adjuster and the third dispenser to provide the rinsing of the surface of the substrate at approximately 20 to 30 degrees Celsius for approximately 1 to 3 minutes.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Like reference numerals designate like structural elements.

DETAILED DESCRIPTION

The embodiments described herein provide a method and system for cleaning platinum residues on a semiconductor substrate It will be obvious, however, to one skilled in the art, that the present invention may be practiced without some or all of these specific details. In other instances, well known process operations have not been described in detail in order not to unnecessarily obscure the present invention.

Figure 1:
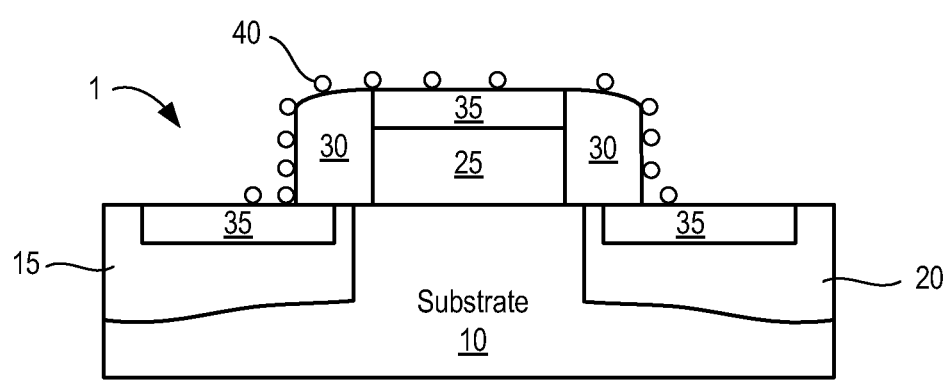
FIG. 1 is a schematic diagram of platinum residuals on an integrated circuit material, in accordance with embodiments of the invention.

FIG. 1 is a schematic diagram of a device 1 with platinum residue 40, in accordance with embodiments described herein. As shown, device 1 includes a substrate 10, source 15, drain 20, polysilicon (PolySi) 25, silicon nitride (SiN) 30, nickel-platinum silicide (NiPtSi) 35, and platinum (Pt) 40. According to one embodiment herein, device 1 is a field effect transistor (FET) and PolySi 25 is a gate for device 1, SiN 30 is an insulator for device 1, and NiPtSi 35 are contact electrodes for source 15, drain 20, and PolySi 25.

In addition, device 1 is surrounded by Pt particles 40. According to one embodiment herein, as described below, Pt particles 40 constitute residual material from an annealing process used to form NiPtSi 35. For example, during the fabrication of device 1, the following may occur to produce Pt particles 40: a pre-clean step; deposition of nickel-platinum (10% Pt) (weight/weight) film (e.g., approximately 100 Å thick); a first rapid thermal annealing (RTA1) at a temperature range of approximately 200° C. to 400° C.; stripping the excess nickel material using a sulfuric acid-hydrogen peroxide mixture (SPM) at approximately 120° C. (i.e., the NiPt strip); a second rapid thermal annealing (RTA2) at a temperature range of approximately 400° C. to 600° C.; and stripping the excess platinum material (i.e., the Pt strip).

Figure 2:
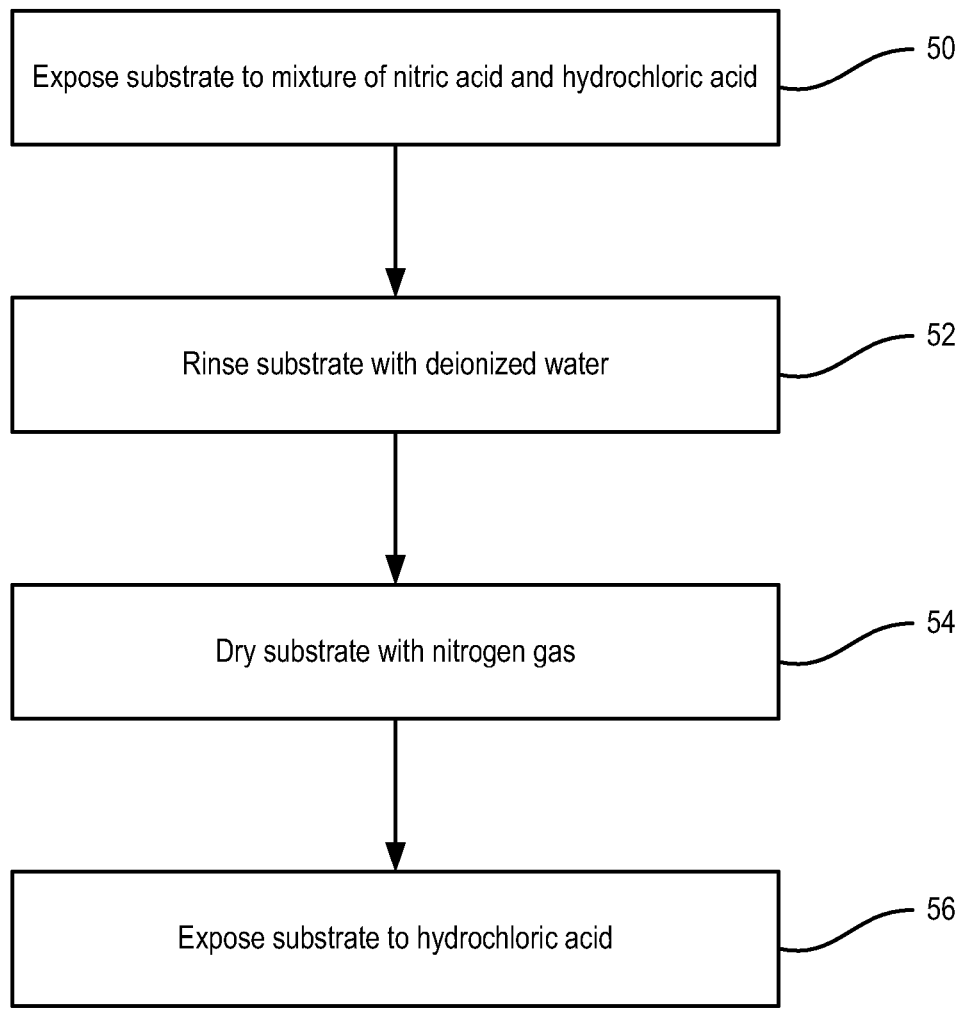
FIG. 2 illustrates a method for removing platinum residues from the surface of a substrate, in accordance with some embodiments of the invention.

FIG. 2 illustrates an improved method for removing platinum residues from the surface of a substrate, in accordance with some embodiments of the invention. It will be noted that the disclosed method can be implemented after the RTA1 or after RTA2. According to the method, at method operation 50, the substrate surface is exposed to aqua regia, which is a mixture of nitric acid and hydrochloric acid having a molar ratio ($HNO_3$:HCl) of approximately 1:3 to 1:12. The exposure to aqua regia is performed at approximately 30 to 50 degrees Celsius for approximately 3 to 7 minutes.

After the exposure to aqua regia, at method operation 52 the substrate surface is rinsed with deionized water at approximately 20 to 30 degrees Celsius for approximately 1 to 3 minutes. Optionally, at method operation 54, the substrate surface is dried by applying an inert gas such as nitrogen for approximately 30 seconds or as long as is necessary to adequately dry the substrate surface.

Then at operation 56, the substrate surface is exposed to a hydrochloric acid solution at a concentration of approximately 10 to 20% by volume. In one embodiment, the exposure to the HCl solution is performed at a temperature of approximately 40 to 80 degrees Celsius for approximately 1 to 5 minutes. In another embodiment, the exposure to the HCl solution is performed at a temperature of approximately 60 to 80 degrees Celsius for approximately 1 to 3 minutes. In one embodiment, the HCl solution is saturated with chlorine gas prior to applying it to the substrate surface. While specific ranges for the various variables have been disclosed, it will be appreciated that the particular concentrations, temperatures, and times may be optimized for a particular fabricated substrate so as to provide adequate cleaning of platinum residuals while maximizing throughput.

The disclosed method provides for effective removal of platinum residuals from a substrate surface. In the first exposure operation, aqua regia reacts with platinum residue as follows:

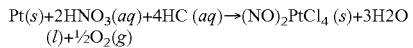

In the second exposure operation, the insoluble $(NO)_2 PtCl_4$ (s) reacts with HCl as follows:

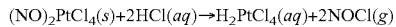

The chloroplatinous acid ($H_2PtCl_4$) can be further oxidized to chloroplatinic acid ($H_2PtCl_6$) by saturating the solution with chlorine while heating. The reaction is as follows:

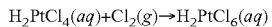

The result of the method is that platinum is oxidized to a highly soluble form ($Pt^{4+}$), thereby enabling the platinum residuals to dissolve into solution from the substrate surface.

Furthermore, the disclosed method for removing platinum residues provides several benefits over prior art methods. Notably, the wet chemistry enables complete removal of Pt/NiPt residues without forming shallow craters devoid of silicide in the Ni(Pt)Si film. In experiments performed using the disclosed method, no significant attack on TiN, SiN spacers or $SiO_2$ is observed. Additionally, hydrochloric acid is an inexpensive and environmentally friendly chemical, so the process does not require significant additional expenditures from either a procurement or disposal standpoint. The disclosed chemistry has a short process time, so that a single wafer wet tool can be used to accomplish the Pt removal.

Figure 3:
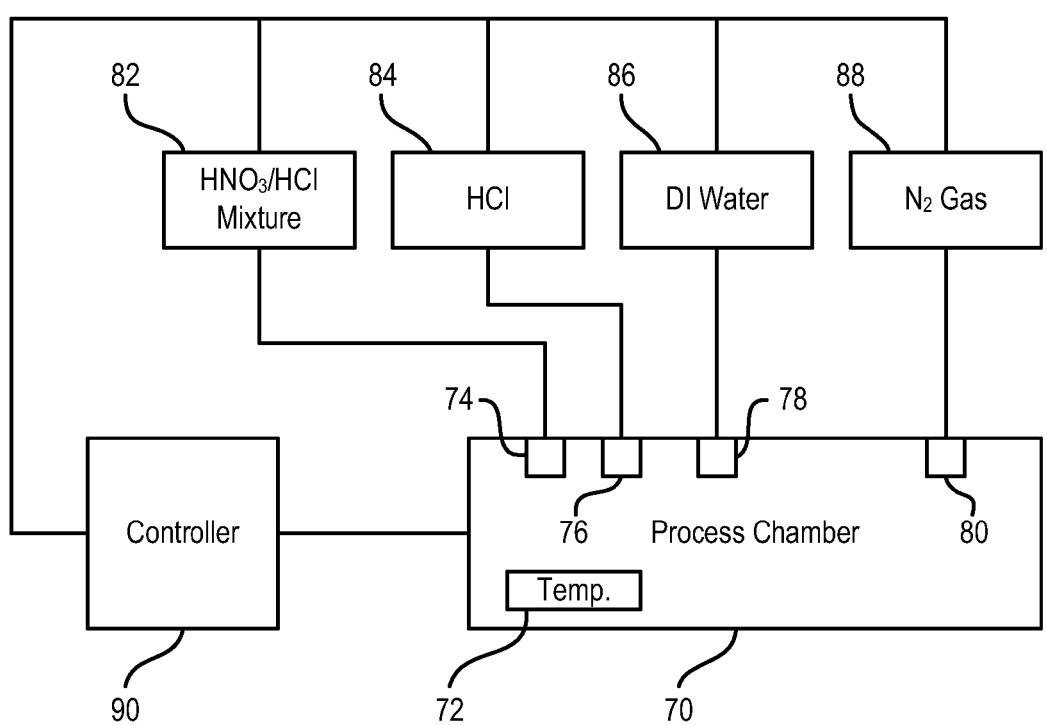
FIG. 3 illustrates a system for cleaning platinum residues from a surface of a substrate, in accordance with some embodiments of the invention.

FIG. 3 illustrates a system for cleaning platinum residues from a surface of a substrate, in accordance with some embodiments of the invention. A process chamber 70 performs processing on one or more substrates, and is configured to clean platinum residues in accordance with the methods described herein. In one embodiment, the process chamber 70 is a single wafer processing chamber. In another embodiment, the process chamber 70 is a batch processing chamber capable of processing multiple wafers simultaneously. The process chamber includes a temperature adjuster 72 for adjusting and controlling the temperature within the process chamber 70.

A dispenser 74 is provided for dispensing aqua regia from an aqua regia solution source 82 onto a surface of a substrate. A dispenser 76 is provided for dispensing a hydrochloric acid solution from an HCl solution source 84 onto the substrate surface. A dispenser 78 is provided for dispensing deionized water from a DI water source 86 to rinse the substrate surface. And a dispenser 80 is provided for dispensing a gas (e.g. an inert gas such as nitrogen) from a gas source 88 to dry the substrate surface. Each of the aqua regia solution source 82, the HCl solution source 84, the DI water source 86, and the gas source 88, is configured to enable adjustment of the temperature of their respective contents.

A controller 90 is provided for controlling process chamber 70, the temperature adjuster 72, the dispensers 74, 76, 78, and 80, as well as the various sources 82, 84, 86, and 88. In one embodiment, the controller 90 is configurable to control the various components of the system to perform a platinum cleaning method in accordance with embodiments described herein. Thus, in one embodiment, the controller 90 is configured to control each of the aqua regia solution source 82, the HCl solution source 84, the DI water source 86, and the gas source 88 to maintain or adjust the temperature of their respective contents to predefined temperature levels in accordance with the cleaning method. The controller 90 is also configured to control the temperature adjuster 72 to adjust the temperature of the process chamber 70 to a predefined level as is necessary for the operations of the cleaning method. The controller 90 controls the dispensers 74, 76, 78, and 80 to dispense the aqua regia onto the substrate, rinse the substrate with DI water, gas dry the substrate, and dispense the HCl solution onto the substrate for the appropriate lengths of time as required by the method.

The presently described method for removing platinum residuals from a substrate surface may be optimized for a particular substrate by using a High-Productivity Combinatorial (HPC) screening process, in accordance with an embodiment of the invention. Details regarding the HPC process are provided in U.S. Patent Application Nos. U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

To reduce the number of product wafers required for process development, an HPC methodology can be employed to screen for the etch rates of all layers across a range of process conditions of interest. For example, in one embodiment, the removal rate of Pt residues is tested for a first blanket wafer including NiPt (10% Pt) (weight/weight), a second blanket wafer including NiPt plus an RTA1 process (temperature ranging from 200 to 400 degrees Celsius), and a third blanket wafer including NiPt plus an RTA2 process (temperature ranging from 400 to 600 degrees Celsius). The HPC process can be configured for testing across varying times, temperatures, and HCl concentration, by way of example.

Embodiments of the present invention provide greatly improved methods for cleaning platinum residuals from a substrate surface. It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

Any of the operations described herein that form part of the invention are useful machine operations. The invention also relates to a device or an apparatus for performing these operations. The apparatus can be specially constructed for the required purpose, or the apparatus can be a general-purpose machine selectively activated or configured by a computer program stored in the machine. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for cleaning platinum residues from a surface of a semiconductor substrate, comprising:
   exposing the surface of the semiconductor substrate to a first solution containing a mixture of nitric acid and hydrochloric acid;
   saturating a second solution with chlorine gas prior to applying the second solution to the surface of the semiconductor substrate; and
   after exposing the surface of the semiconductor substrate to the first solution, exposing the surface of the semiconductor substrate to the second solution containing hydrochloric acid wherein the first solution and the second solution are different.

2. The method for cleaning platinum residues from a surface of a semiconductor substrate as recited in claim 1, wherein the molar ratio of nitric acid to hydrochloric acid in the first solution is approximately 1:3 to 1:12; and wherein the second solution has a concentration of hydrochloric acid of approximately 10% to 20% by volume.

3. The method for cleaning platinum residues from a surface of a semiconductor substrate as recited in claim 1, wherein the exposure to the first solution is performed at approximately 20 to 30 degrees Celsius for approximately 3 to 7 minutes.

4. The method for cleaning platinum residues from a surface of a semiconductor substrate as recited in claim 1, wherein the exposure to the second solution is performed at approximately 40 to 80 degrees Celsius for approximately 1 to 5 minutes.

5. The method for cleaning platinum residues from a surface of a semiconductor substrate as recited in claim 1, wherein the exposure to the second solution is performed at approximately 60 to 80 degrees Celsius for approximately 1 to 3 minutes.

6. The method for cleaning platinum residues from a surface of a semiconductor substrate as recited in claim 1, further comprising,
after the exposure to the first solution, rinsing the surface of the substrate with de-ionized water before exposing the surface to the second solution.

7. The method for cleaning platinum residues from a surface of a semiconductor substrate as recited in claim 6, wherein the rinsing of the surface is performed at approximately 20 to 30 degrees Celsius for approximately 1 to 3 minutes.

8. A method for cleaning platinum residues from a surface of a semiconductor substrate, comprising:
exposing the surface the semiconductor substrate of to a first solution containing a mixture of nitric acid and hydrochloric acid at a molar ratio of approximately 1:3 to 1:12;
rinsing the surface of the semiconductor substrate with deionized water;
saturating a second solution with chlorine gas prior to applying the second solution to the surface of the semiconductor substrate; and
exposing the surface of the semiconductor substrate to a second solution containing hydrochloric acid at a concentration of approximately 10% to 20% by volume wherein the first solution and the second solution are different.

9. The method for cleaning platinum residues from a surface of a semiconductor substrate as recited in claim 8, further comprising:
after rinsing the surface of the substrate, drying the surface with an inert gas prior to exposing the surface to the second solution.

10. The method for cleaning platinum residues from a surface of a semiconductor substrate as recited in claim 9, wherein the inert gas is nitrogen.

11. The method for cleaning platinum residues from a surface of a semiconductor substrate as recited in claim 8, wherein the exposure to the first solution is performed at approximately 20 to 30 degrees Celsius for approximately 3 to 7 minutes; and
wherein the exposure to the second solution is performed at approximately 60 to 80 degrees Celsius for approximately 1 to 3 minutes.

* * * * *